(12) United States Patent
Zhang et al.

(10) Patent No.: US 11,081,671 B2
(45) Date of Patent: Aug. 3, 2021

(54) OLED ENCAPSULATION STRUCTURE, DISPLAY DEVICE AND METHOD FOR MANUFACTURING OLED ENCAPSULATION STRUCTURE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Guolin Zhang, Beijing (CN); Jiuyang Cheng, Beijing (CN); Jiahong Zou, Beijing (CN); Wenhao Xiao, Beijing (CN); Liangfeng Mou, Beijing (CN); Junliang Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/345,272

(22) PCT Filed: Jul. 27, 2018

(86) PCT No.: PCT/CN2018/097401
§ 371 (c)(1),
(2) Date: Apr. 26, 2019

(87) PCT Pub. No.: WO2019/024777
PCT Pub. Date: Feb. 7, 2019

(65) Prior Publication Data
US 2019/0252641 A1    Aug. 15, 2019

(30) Foreign Application Priority Data

Aug. 2, 2017 (CN) .......................... 201710655149.7

(51) Int. Cl.
*H01L 51/52* (2006.01)

(52) U.S. Cl.
CPC ........ *H01L 51/5256* (2013.01); *H01L 51/524* (2013.01)

(58) Field of Classification Search
CPC .................................................. H01L 51/5256
See application file for complete search history.

(56) References Cited

U.S. PATENT DOCUMENTS

| 2017/0092897 A1 | 3/2017 | Liu |
| 2017/0271623 A1 | 9/2017 | Wang et al. |

(Continued)

FOREIGN PATENT DOCUMENTS

| CN | 203481275 U | 3/2014 |
| CN | 103996629 A | 8/2014 |

(Continued)

OTHER PUBLICATIONS

Search Report and Written Opinion for International Patent Application No. PCT/CN2018/097401 dated Nov. 5, 2018.

(Continued)

*Primary Examiner* — Walter H Swanson
(74) *Attorney, Agent, or Firm* — Calfee, Halter & Griswold LLP

(57) ABSTRACT

The present disclosure discloses an OLED encapsulation structure, a display device and a method for manufacturing an OLED encapsulation structure. The OLED encapsulation structure includes an OLED device and a plurality of film layers covering the OLED device. The plurality of film layers includes an inorganic layer and an organic layer stacked alternately, and contacting surfaces of any two film layers in contact with each other among the plurality of film (Continued)

layers include complementary topographies such that the any two film layers in contact with each other are stuck with each other.

12 Claims, 5 Drawing Sheets

(56) References Cited

U.S. PATENT DOCUMENTS

| | | |
|---|---|---|
| 2018/0047940 A1 | 2/2018 | Sonoda et al. |
| 2019/0252641 A1 | 8/2019 | Zhang et al. |

FOREIGN PATENT DOCUMENTS

| | | |
|---|---|---|
| CN | 203883009 U | 10/2014 |
| CN | 104701465 A | 6/2015 |
| CN | 106409873 A | 2/2017 |
| CN | 106684256 A | 5/2017 |
| CN | 106847834 A | 6/2017 |
| CN | 106935633 A | 7/2017 |
| CN | 106992263 A | 7/2017 |
| CN | 107394059 A | 11/2017 |
| WO | 2016140130 A1 | 9/2016 |

OTHER PUBLICATIONS

First Office Action for Chinese Patent Application No. 201710655149.7 dated Aug. 28, 2018.
Second Office Action for Chinese Patent Application No. 201710655149.7 dated Apr. 25, 2019.
Third Office Action for Chinese Patent Application No. 201710655149.7 dated Jul. 19, 2019.

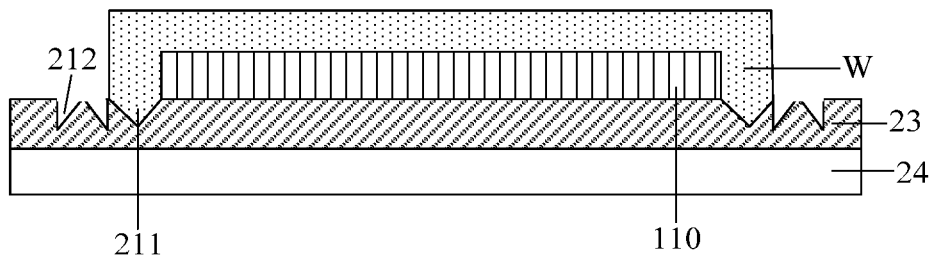

FIG. 7D

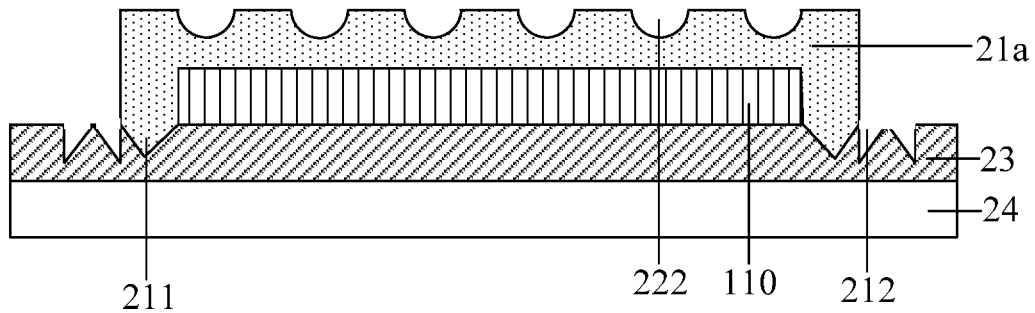

FIG. 7E

| forming organic material layer covering first inorganic layer by pre-process, side of organic material layer contacting first inorganic layer is provided with first engaging protrusion that is stuck in first engaging slot | 7021 |
|---|---|
| processing organic material layer by patterning process, side of organic material layer that is not in contact with first inorganic layer is provided with first engaging protrusion to obtain organic layer | 7022 |

FIG. 7F

OLED ENCAPSULATION STRUCTURE, DISPLAY DEVICE AND METHOD FOR MANUFACTURING OLED ENCAPSULATION STRUCTURE

CROSS REFERENCE TO RELATED APPLICATIONS

The present application is a 35 U.S.C. § 371 national stage application of PCT International Application No. PCT/CN2018/097401, filed on Jul. 27, 2018, which claims the priority of Chinese Patent Application No. 201710655149.7 filed on Aug. 2, 2017, the content of which is incorporated herein by reference in its entirety.

FIELD

The present disclosure relates to the field of display device packaging, and in particular to an OLED encapsulation structure, a display device, and a method for manufacturing an OLED encapsulation structure.

BACKGROUND

Organic Light-Emitting Diode (OLED) devices have the advantages of thinness, low power consumption, high contrast, high color gamut and flexible display, and are widely used in electronic products. The application of OLED devices usually requires an OLED encapsulation structure to encapsulate the OLED device. In the related art, the encapsulation effect of the OLED encapsulation structure is relatively poor.

SUMMARY

According to a first aspect of the present application, there is provided an OLED encapsulation structure, comprising an OLED device and a plurality of film layers covering the OLED device. The plurality of film layers include an inorganic layer and an organic layer stacked alternately, and contacting surfaces of any two film layers in contact with each other among the plurality of film layers include complementary topographies such that the any two film layers in contact with each other are stuck with each other.

In some embodiments, the complementary topographies include a first engaging slot of one of the any two film layers in contact with each other and a first engaging protrusion of the other one of the any two film layers in contact with each other, wherein the first engaging protrusion is stuck in the first engaging slot.

In some embodiments, among the plurality of film layers, a film layer closest to the OLED device and a film layer farthest from the OLED device are first film layers, an inorganic layer not belonging to the first film layers is a second film layer, and an organic layer not belonging to the first film layers is a third film layer. Two film surfaces of the second film layer are provided with the first engaging slot, and two film surfaces of the third film layer are provided with the first engaging protrusion.

In some embodiments, orthographic projections of the first engaging slots on the two film surfaces of the second film layer, which are projected on a plane of the second film layer, do not have an overlapping area, and orthographic projections of the first engaging protrusions on the two film surfaces of the third film layer, which are projected on a plane of the third film layer, do not have an overlapping area.

In some embodiments, orthographic projections of the first engaging slots on the two film surfaces of the second film layer, which are projected on a plane of the second film layer, have an overlapping area, and orthographic projections of the first engaging protrusions on the two film surfaces of the third film layer, which are projected on a plane of the third film layer, have an overlapping area.

In some embodiments, among the plurality of film layers, a film layer closest to the OLED device and a film layer farthest from the OLED device are first film layers, an inorganic layer not belonging to the first film layers is a second film layer, and an organic layer not belonging to the first film layers is a third film layer. Two film surfaces of the second film layer are provided with the first engaging protrusion, and two film surfaces of the third film layer are provided with the first engaging slot.

In some embodiments, orthographic projections of the first engaging protrusions on the two film surfaces of the second film layer, which are projected on a plane of the second film layer, do not have an overlapping area, and orthographic projections of the first engaging slots on the two film surfaces of the third film layer, which are projected on a plane of the third film layer, do not have an overlapping area.

In some embodiments, orthographic projections of the first engaging protrusions on the two film surfaces of the second film layer, which are projected on a plane of the second film layer, have an overlapping area, and orthographic projections of the first engaging slots on the two film surfaces of the third film layer, which are projected on a plane of the third film layer, have an overlapping area.

In some embodiments, the first film layer includes a first film surface in contact with a film layer of the plurality of film layers not belonging to the first film layers, wherein the first film surface includes the first engaging slot or the first engaging protrusion.

In some embodiments, the OLED encapsulation structure further includes a buffer layer, wherein the OLED device is arranged on the buffer layer, and the buffer layer and at least one film layer of the plurality of film layers include a mating mechanism such that the at least one film layer is stuck with the buffer layer.

In some embodiments, the mating mechanism includes a second engaging slot of the buffer layer and a second engaging protrusion of the at least one film layer, wherein the second engaging protrusion is stuck in the second engaging slot.

In some embodiments, wherein the mating mechanism includes a second engaging protrusion of the buffer layer and a second engaging slot of the at least one film layer, wherein the second engaging protrusion is stuck in the second engaging slot.

In some embodiments, a shape of a longitudinal section of the first engaging slot, a shape of a longitudinal section of the first engaging protrusion, a shape of a longitudinal section of the second engaging slot and a shape of a longitudinal section of the second engaging protrusion respectively include any one of a semicircular shape, a trapezoidal shape, a U shape, a V shape and a rectangular shape. The shape of the longitudinal section of the first engaging slot corresponds to the shape of the longitudinal section of the first engaging protrusion, and the shape of the longitudinal section of the second engaging slot corresponds to the shape of the longitudinal section of the second engaging protrusion.

According to a second aspect of the present application, there is provided a display device, comprising the OLED encapsulation structure according to the embodiments of the present application.

According to a third aspect of the present application, there is provided a method for manufacturing an OLED encapsulation structure, comprising the steps of:

forming an inorganic layer covering an OLED device; and forming an organic layer covering the inorganic layer, wherein contacting surfaces of the organic layer and the inorganic layer include complementary topographies such that the organic layer and the inorganic layer are stuck with each other.

In some embodiments, the step of forming the inorganic layer covering the OLED device includes:

forming an inorganic layer covering the OLED device and having a first engaging slot, and the step of forming the organic layer covering the inorganic layer includes:

forming an organic layer covering the inorganic layer and having a first engaging protrusion, wherein the first engaging protrusion is stuck in the first engaging slot.

In some embodiments, the step of forming the inorganic layer covering the OLED device and having the first engaging slot includes:

forming an inorganic material layer covering the OLED device by a plasma chemical vapor deposition process, and processing the inorganic material layer by a patterning process, such that the first engaging slot is formed on the inorganic material layer;

wherein the step of forming the organic layer covering the inorganic layer and having the first engaging protrusion adopts a pre-process, wherein the pre-process includes any one of a sputtering process, an evaporation process and a spin coating process.

In some embodiments, the step of forming the organic layer covering the inorganic layer and having the first engaging protrusion includes:

forming an organic layer covering the inorganic layer and having the first engaging protrusion on its both film surfaces, wherein the first engaging protrusion is stuck in the first engaging slot.

In some embodiments, the step of forming the organic layer covering the inorganic layer and having the first engaging protrusion on its both film surfaces includes:

forming an organic material layer covering the inorganic layer by a pre-process, wherein a side of the organic material layer in contact with the inorganic layer is provided with a first engaging protrusion stuck in the first engaging slot, and wherein the pre-process includes any one of a sputtering process, an evaporation process and a spin coating process, and processing the organic material layer by a patterning process, such that a side of the organic material layer not in contact with the inorganic layer is provided with a first engaging protrusion to obtain the organic layer.

BRIEF DESCRIPTION OF DRAWINGS

In order to more clearly illustrate the technical solutions of the embodiments of the present disclosure, the drawings used in the description of the embodiments will be briefly described below. Apparently, the drawings in the following description are only a part of the embodiments of the present disclosure. The person having ordinary skill in the art can obtain other drawings from these drawings without creative work. In the drawings, FIG. 1 schematically shows the structure of an OLED encapsulation structure according to the related art;

FIG. 7D schematically shows another embodiment of the intermediate structure of the OLED encapsulation structure in the method for manufacturing an OLED encapsulation structure according to the present disclosure;

FIG. 7E schematically shows yet another embodiment of the intermediate structure of the OLED encapsulation structure in the method of manufacturing an OLED encapsulation structure according to the present disclosure;

FIG. 7F schematically shows still another embodiment of the flow of the method for manufacturing an OLED encapsulation structure according to the present disclosure;

The drawings herein are incorporated into the specification and constitute a part of this specification. The drawings show the embodiments of the present disclosure and are used in conjunction with the specification to explain the principles of the present disclosure.

DETAILED DESCRIPTION

To clarify the purposes, solutions and advantages of the present application, the present disclosure will be further described in detail below with reference to the accompanying drawings. It is apparent that the described embodiments are only a part of the embodiments of the disclosure rather than all of them. All other embodiments obtained by the person having ordinary skill in the art based on the embodiments of the present disclosure without making creative effort are within the protection scope of the present disclosure.

OLED devices have the advantages of thinness, low power consumption, high contrast, high color gamut, and flexible display, and are widely used in electronic products.

Flexible OLED devices are the main direction of research and development in the field of display technology. It is well known that the electrode layer and the organic light-emitting layer in the OLED device are very sensitive to the water vapor and oxygen in the air, etc. After the OLED device is eroded by the water vapor, oxygen, etc., the electrode layer and the organic light-emitting layer are susceptible to corrosion resulting in performance degradation, thereby affecting the performance and life-time of the OLED device, and even restricting the development of the OLED device. In order to improve the performance of OLED devices and extend their life-time, OLED devices could be encapsulated by using OLED encapsulation structure. Generally, the OLED encapsulation structure can be a film encapsulation structure. After the OLED device is encapsulated by a thin film encapsulation structure, the flexibility of the OLED device can still be maintained, and the OLED device can be protected from the external environment.

Figure 1:
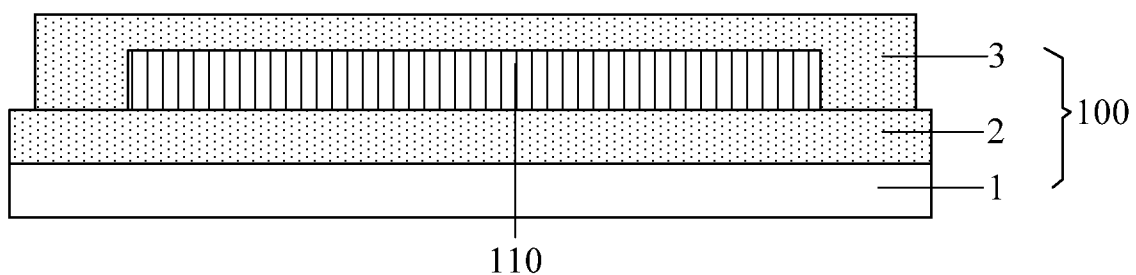

FIG. 1 shows a structural diagram of an OLED encapsulation structure 100 according to the related art. The OLED encapsulation structure 100 includes a first package film layer 2 and a second package film layer 3 which are sequentially disposed on a base substrate 1. An OLED device 110 is disposed between the first package film layer 2 and the second package film layer 3. The first package film layer 2 and the second package film layer 3 surround the OLED device 110. The OLED encapsulation structure 100 can isolate the OLED device 110 from the external environment, thereby preventing the components such as moisture, oxygen, and the like in the environment from eroding the OLED device 110. However, the OLED encapsulation structure 100 shown in FIG. 1 has a poor packaging effect.

The related art also proposes another OLED encapsulation structure which encapsulates the OLED device by a plurality of alternately stacked film layers such that the package effect would be improved. However, the contacting surfaces of two mutually contacting film layers in the OLED encapsulation structure are flat planes. When such OLED encapsulation structure is oscillated or bent, misalignment between the film layers is easy to occur. Therefore, this OLED encapsulation structure has a poor packaging effect and low light extraction efficiency.

An embodiment of the present disclosure provides an OLED encapsulation structure, which has a high encapsulation effect and can improve light extraction efficiency. The OLED encapsulation structure and its manufacturing method according to the embodiments of the present disclosure will be described in detail below.

Figure 2:
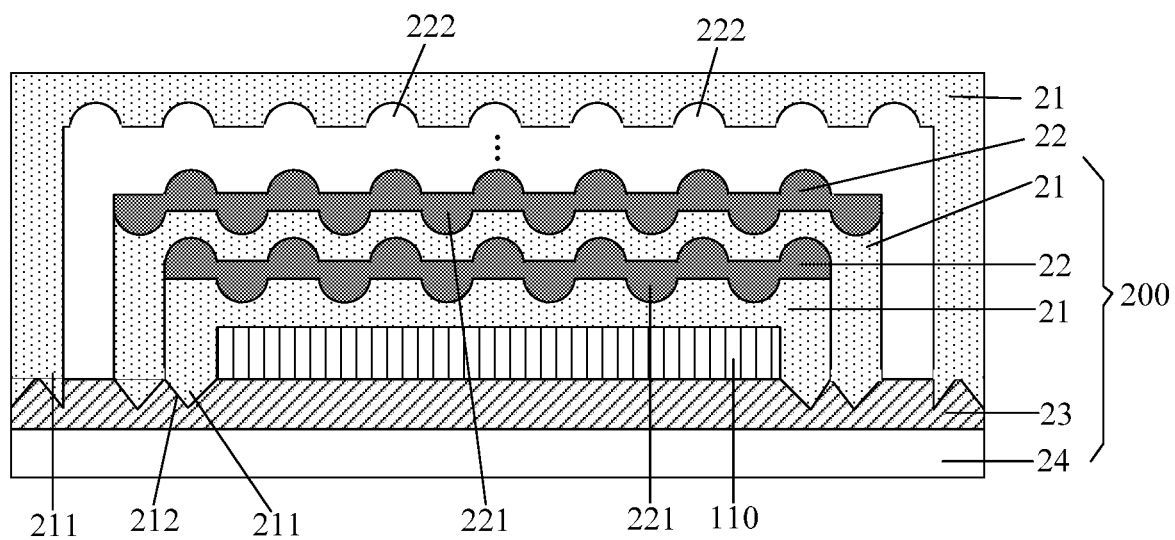
FIG. 2 schematically shows an embodiment of the structure of an OLED encapsulation structure according to the present disclosure.

FIG. 2 schematically illustrates the structure of an OLED encapsulation structure 200 in accordance with an embodiment of the present disclosure. The OLED encapsulation structure 200 includes a plurality of film layers covering the OLED device 110. The plurality of film layers include alternately stacked inorganic layer 21 and organic layer 22, and the contacting surfaces of any two film layers that are in contact with each other in the plurality of film layers include complementary topographies such that the two film layers are stuck with each other. The term "any two film layers that are in contact with each other" especially refers to two film layer the respective main surfaces of which are in contact with each other. The main surface of the film layer refers to a surface parallel to the extending directions of the OLED device. The complementary structures of the two film layer surfaces prevent the misalignment between the film layers, thereby improving the encapsulation effect of the OLED encapsulation structure.

In some embodiments, the complementary structures include a protrusion and a recess, which may specifically be an engaging protrusion and an engaging slot. In a more specific embodiment, one of the any two film layers that are in contact with each other is provided with a first engaging slot 222, and the other film layer thereof is provided with a first engaging protrusion 221. The first engaging protrusion 221 is stuck in the first engaging slot 222. In some embodiments, there is no gap between the first engaging protrusion 221 and the first engaging slot 222. In some embodiments, among the inorganic layer 21 and the organic layer 22 that are in contact with each other, the inorganic layer 21 includes thereon the first engaging slot 222, and the organic layer 22 includes thereon the first engaging protrusion 221. The first engaging protrusion 221 on the organic layer 22 is stuck in a corresponding first engaging slot 222 on the inorganic layer 21 such that the inorganic layer 21 is stuck to the organic layer 22.

Alternatively, the plurality of film layers of the OLED encapsulation structure 200 may be divided into a first film layer, a second film layer, and a third film layer. The film layer closest to the OLED device 110 and the film layer farthest from the OLED device 110 are the first film layer. That is, only one side of the first film layer is provided with the first engaging protrusion 221 or the first engaging slot 222. The inorganic layer 21 in the plurality of film layers that does not belong to the first film layer is a second film layer. The organic layer 22 in the plurality of film layers that does not belong to the first film layer is a third film layer. In an embodiment, the two film surfaces of the second film layer both include the first engaging slots 222, and the two film surfaces of the third film layer both include the first engaging protrusions 221. In another embodiment, the two film surfaces of the second film layer both include the first engaging protrusions 221, and the two film surfaces of the third film layer both include the first engaging slots 222. As shown in FIG. 2, the two film surfaces of the inorganic layer 21 are both provided with the first engaging slots 222, and the two film surfaces of the organic layer 22 are both provided with the first engaging protrusions 221.

It should be understood that in some embodiments, the second film layer may be an organic layer 22 and the third film layer may be an inorganic layer 21. In addition, in some embodiments, the two film surfaces of the second film layer are respectively provided with a first engaging slot 222 and a first engaging protrusion 221, and the two film surfaces of the third film layer are respectively provided with a first engaging slot 222 and a first engaging protrusion 221. In this case, the first engaging slots 222 and the first engaging protrusions 221 are respectively disposed on the film surfaces of the second film layer and the third film layer that face to the same direction. For example, in some embodiments, the first engaging slots 222 are disposed on the film surfaces of the second film layer and the third film layer away from the OLED device 110, and the first engaging protrusions 221 are disposed on the film surfaces of the second film layer and the third film layer closest to the OLED device 110.

In some embodiments, the orthographic projections of the first engaging slots 222 on the two film surfaces of the second film layer projected on the plane of the second film layer do not have an overlapping area, and the orthographic projections of the first engaging protrusion 221 on the two film surfaces of the third film layer projected on the plane of the third film layer do not have an overlapping area. Alternatively, the orthographic projections of the first engaging protrusion 221 on the two film surfaces of the second film layer projected on the plane of the second film layer do not have an overlapping area, and the orthographic projections of the first engaging slot 222 on the two film surfaces of the third film layer projected on the plane of the third film layer do not have an overlapping area. When the second film layer is the inorganic layer 21 and the third film layer is the organic layer 22, the orthographic projections of the first engaging slots 222 on the two film surfaces of the inorganic layer 21 projected on the plane of the inorganic layer 21 do not overlap, and the orthographic projections of the first engaging protrusions 221 on the two film surfaces of the organic layer 22 projected on the plane of the organic layer 22 do not overlap.

In some embodiments, the orthographic projections of the first engaging slots 222 on the two film surfaces of the second film layer projected on the plane of the second film layer have an overlapping area, and the orthographic projections of the first engaging protrusions 221 on the two film surfaces of the third film layer projected on the plane of the third film layer have an overlapping area. Alternatively, the orthographic projections of the first engaging protrusions 221 on the two film surfaces of the second film layer projected on the plane of the second film layer have an overlapping area, and the orthographic projections of the first engaging slots 222 on the two film surfaces of the third film layer projected on the plane of the third film layer have an overlapping area.

A first engaging slot 222 or a first engaging protrusion 221 may be disposed on a first film surface of the first film layer. The first film surface is the one of the two film surfaces of the first film layer that is in contact with the second film layer or the third film layer. In some embodiments, as shown in FIG. 2, the first film layer includes the inorganic layer 21 in contact with the OLED device 110 and the inorganic layer 21 located at the outermost side of the OLED encapsulation structure 200. The respective first film surfaces of the two first film layers are in contact with the organic layer 22, respectively. The first film surface of the first film layer includes a first engaging slot 222. In other embodiments, the first film layer may be the organic layer 22, and/or, the first engaging protrusion 221 may be disposed on the first film surface of the first film layer.

Further, the OLED encapsulation structure 200 further includes a buffer layer 23. The OLED device 110 is disposed on the buffer layer 23, and at least one of the plurality of film layers is in contact with the buffer layer 23. Specifically, the buffer layer 23 and the film layer which is in contact with the buffer layer 23 include a mating mechanism such that the buffer layer 23 and the film layer which is in contact with the buffer layer 23 are stuck with each other. In some embodiments, the inorganic layer 21 in the plurality of film layers is in contact with the buffer layer 23. In this case, the inorganic layer 21 in contact with the buffer layer 23 is stuck in the buffer layer 23.

In some embodiments, the mating mechanism includes a second engaging slot 212 of the buffer layer 23 and a second engaging protrusion 211 on the film layer in contact with the buffer layer 23. The second engaging protrusion 211 is stuck in the second engaging slot 212, and there is no gap between the second engaging protrusion 211 and the second engaging slot 212. Alternatively, the buffer layer 23 includes the second engaging protrusion 211, and the film layer in contact with the buffer layer 23 includes the second engaging slot 212. In some embodiments, the film layer in contact with the buffer layer 23 is an inorganic layer 21. In this case, the buffer layer 23 includes the second engaging slot 212, and the inorganic layer 21 includes the second engaging protrusion 211. The second engaging protrusion 211 is stuck in the second engaging slot 212 such that the inorganic layer 21 is stuck with the buffer layer 23.

Further, the OLED encapsulation structure 200 may further include a substrate 24. The substrate 24 may be a transparent substrate, which can specifically be made of a non-metallic material having a certain hardness and guides light, such as glass, quartz or transparent resin, etc.

In some embodiments, the shape of the longitudinal section of the first engaging slot 222 may be any one of a semicircular shape, a trapezoidal shape, a U shape, a V shape and a rectangular shape, so do the shape of the longitudinal section of the first engaging protrusion 221, the shape of the longitudinal section of the second engaging slot 212 and the shape of the longitudinal section of the second engaging protrusion 211, and the shape of the longitudinal section of the first engaging slot 222 corresponds to the shape of the longitudinal section of the first engaging protrusion 221, and the shape of the longitudinal section of the second engaging slot 212 corresponds to the shape of the longitudinal section of the second engaging protrusion 211. The longitudinal section is a plane perpendicular to the extension plane of the OLED device 110. The term "correspond" means that the shapes of the longitudinal sections cooperate with each other to prevent relative displacement of the two layers in contact with each other. In an embodiment of the present disclosure, the shape of the longitudinal section of the first engaging slot 222 is the same as the shape of the longitudinal section of the first engaging protrusion 221, and the shape of the longitudinal section of the second engaging slot 212 is the same as the shape of the longitudinal section of the second engaging protrusion 211. In an embodiment, the longitudinal section of the first engaging slot 222 is perpendicular to the plane of the aperture, and the longitudinal section of the second engaging slot 212 is perpendicular to the plane of the aperture, wherein the plane of aperture is a plane parallel to the extension plane of the OLED device 110.

Figure 3:
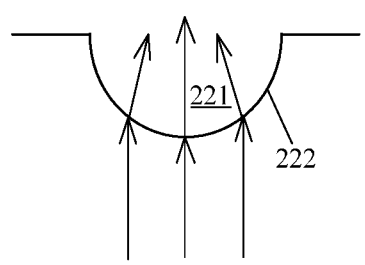
FIG. 3 schematically shows an embodiment of the optical path in the OLED encapsulation structure according to the present disclosure.
Figure 4:
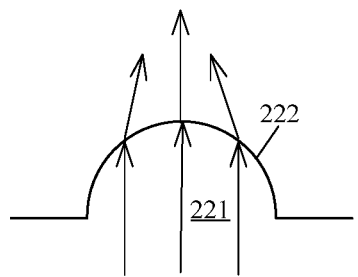
FIG. 4 schematically shows another embodiment of the optical path in the OLED encapsulation structure according to the present disclosure.

In some embodiments, the first engaging slot 222 is a semi-circular engaging slot, the first engaging protrusion 221 is a semi-circular engaging protrusion, the second engaging slot 212 is a V-shaped engaging slot, and the second engaging protrusion 211 is a V-shaped engaging protrusion. It should be noted that, in an embodiment of the present disclosure, the semi-circular engaging slot or engaging protrusion can converge the light emitted by the OLED device 110. Therefore, the light extraction efficiency of the OLED encapsulation structure 200 can be improved by using the semi-circular first engaging slot 222 and the semi-circular first engaging protrusion 221. FIG. 3 and FIG. 4 show two optical path diagrams of light emitted by the OLED device 110, with arrows indicating the direction of travel of the light. When the light emitted by the OLED device 110 passes through the interface between the semi-circular engaging protrusion and the semi-circular engaging slot (including the interface shown in FIG. 3, the arc center of which is above, and the interface shown in FIG. 4, the arc center of which is below), the exiting direction of the light can be changed such that the lights are converged, thereby improving the light extraction efficiency of the OLED encapsulation structure 200. Alternatively, in the OLED encapsulation structure 200, the refractive index of the material of the first engaging protrusion 221 may be greater than the refractive index of the material of the first engaging slot 222, so that the combination of the engaging slot and the engaging protrusion converge the light. In addition, in the embodiment of the present disclosure, the V-shaped second engaging slot 212 and the V-shaped second engaging protrusion 211 stuck in the second engaging slot 212 may improve the sealing effect of the edges of the OLED encapsulation structure 200.

Figure 5:
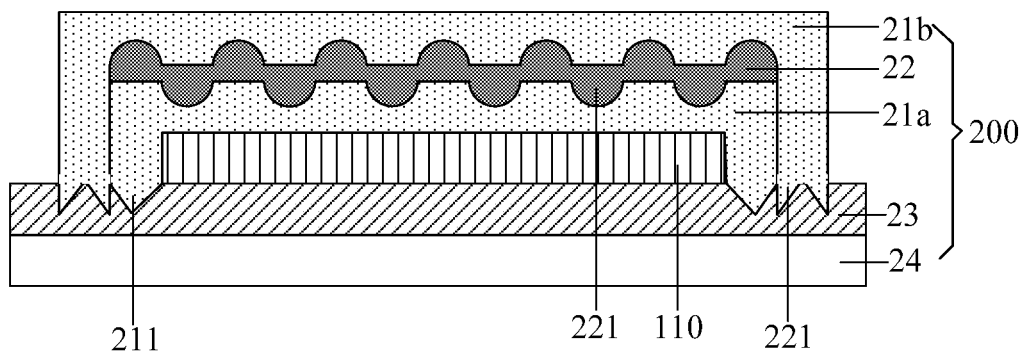
FIG. 5 schematically shows another embodiment of the structure of the OLED encapsulation structure according to the present disclosure.

FIG. 5 illustrates an OLED encapsulation structure 200 in accordance with an embodiment of the present disclosure. The OLED encapsulation structure 200 includes three film layers. Among the three film layers, the first film layers (including the film layer closest to the OLED device 110 and the film layer farthest from the OLED device 110) are first and second inorganic layers 21a and 21b.

Alternatively, in an embodiment of the present disclosure, in the two film layers that are in contact with each other, the surface area of the film layer remote from the OLED device 110 may be larger than the surface area of the film layer adjacent to the OLED device 110. This facilitates the coverage of the OLED device by a plurality of film layers for the encapsulating of the OLED device.

In an embodiment of the present disclosure, the inorganic layer 21 may be formed by at least one of silicon nitride, silicon oxide, and silicon hydroxide. The organic layer 22 can be formed by a polyacrylate material. The polyacrylate material may be, for example, a negative polyacrylate material or the like. The material of the buffer layer 23 may be the same as or different from the material of the inorganic layer 21, which is not limited in the present disclosure.

The OLED encapsulation structure according to the embodiment of the present disclosure prevents the misalignments between the film layers because the film layers that are in contact with each other are stuck, thereby improving the encapsulation effect of the OLED encapsulation structure. The OLED encapsulation structure according to the embodiment of the present disclosure can effectively isolate the components such as moisture, oxygen, and the like in the environment from the OLED device, thereby extending the life-time of the OLED device.

A method for manufacturing an OLED encapsulation structure in accordance with an embodiment of the present disclosure and its principle are described below.

Figure 6:
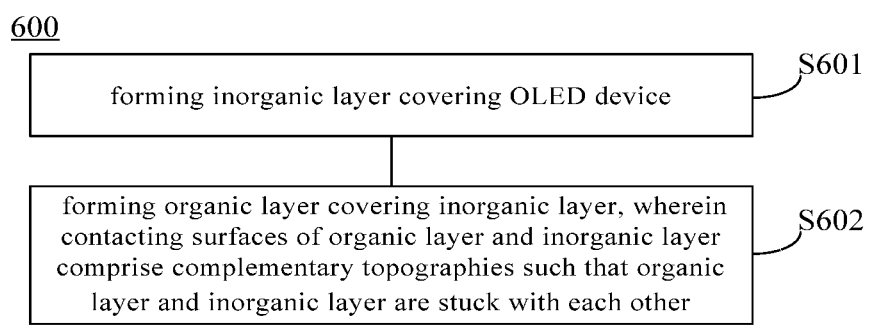
FIG. 6 schematically shows an embodiment of the flow chart of the method for manufacturing an OLED encapsulation structure according to the present disclosure.

FIG. 6 illustrates a flow chart of the method 600 for manufacturing an OLED encapsulation structure in accordance with an embodiment of the present disclosure. The method can be used to package an OLED device to form the OLED encapsulation structure in accordance with an embodiment of the present disclosure. In an embodiment, the method includes:

Step S601: forming an inorganic layer covering the OLED device on the outside of the OLED device;

Step S602: forming an organic layer covering the inorganic layer and stuck with the inorganic layer on the outside of the inorganic layer.

As described above, the method for manufacturing the OLED encapsulation structure according to an embodiment of the present disclosure causes the organic layer and the inorganic layer to be stuck. Therefore, misalignment between the film layers can be avoided, thereby improving the encapsulation effect of the OLED encapsulation structure.

In some embodiments, the step S601 includes: forming an inorganic layer covering the OLED device and having a first engaging slot on the outside of the OLED device. In some embodiments, this step can be performed by the following process: forming a layer of inorganic material covering the OLED device on the outside of the OLED device by a plasma chemical vapor deposition process; and processing the layer of inorganic material by a patterning process to obtain an organic layer having a first engaging slot.

In some embodiments, the step S602 includes: forming an organic layer covering the inorganic layer and having a first engaging protrusion on the outside of the inorganic layer, wherein the first engaging protrusion is stuck in the first engaging slot. In some embodiments, this step is accomplished by a pre-process. The pre-process includes any one of a sputtering process, an evaporation process, and a spin coating process.

In some embodiments, the step S602 further includes: forming an organic layer covering the inorganic layer and having first engaging protrusions on its both film surfaces on the outside of the inorganic layer. In an embodiment, this step specifically includes: forming a layer of organic material covering the inorganic layer on the outside of the inorganic layer by a pre-process, the side of the organic material layer contacting the inorganic layer having the first engaging protrusion that is stuck in the engaging slot of the inorganic layer, wherein the pre-process includes any one of a sputtering process, an evaporation process, and a spin coating process; and processing the layer of organic material layer by a patterning process to obtain an organic layer, the side not in contact with the inorganic layer of the organic layer having the first engaging protrusion.

The method for manufacturing the OLED encapsulation structure according to an embodiment of the present disclosure can avoid the misalignment between the film layers because the organic layer and the inorganic layer are stuck, thereby solving the problem of poor packaging effect.

Figure 7A:
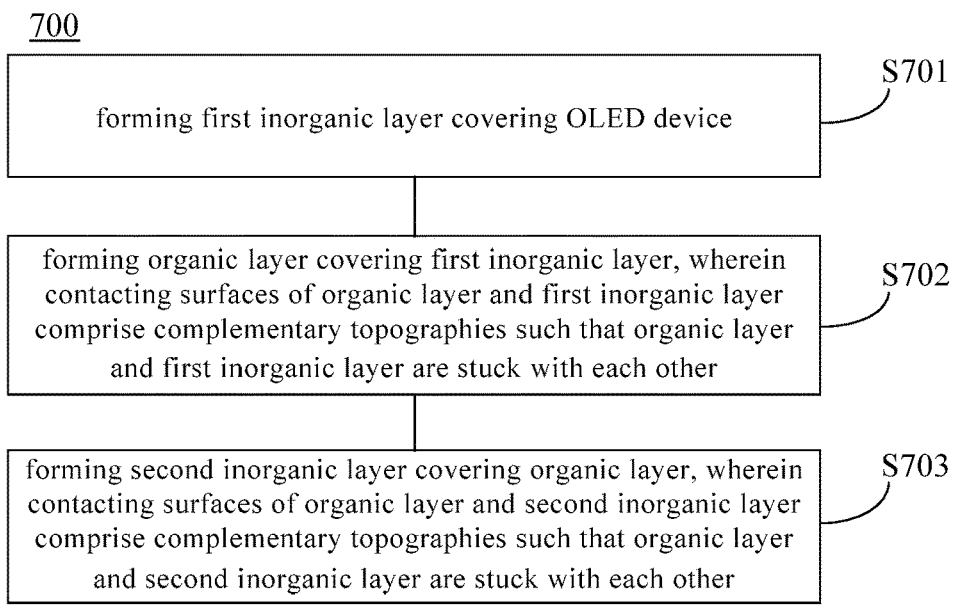
FIG. 7A schematically shows another embodiment of the flow of the method for manufacturing an OLED encapsulation structure according to the present disclosure.

FIG. 7A illustrates a flow chart of another method for manufacturing an OLED encapsulation structure in accordance with an embodiment of the present disclosure. The method can be used to manufacture the OLED encapsulation structures 200 as shown in FIG. 2 or FIG. 5. The method is now described by taking the OLED encapsulation structure 200 shown in FIG. 5 as an example.

Referring to FIG. 7A, the method includes:

Step S701: forming a first inorganic layer covering the OLED device on the outside of the OLED device;

Step S702: forming an organic layer covering the first inorganic layer and being stuck to the first inorganic layer on the outside of the first inorganic layer; and Step S703: forming a second inorganic layer covering the organic layer and being stuck to the organic layer on the outside of the organic layer.

Figure 7B:
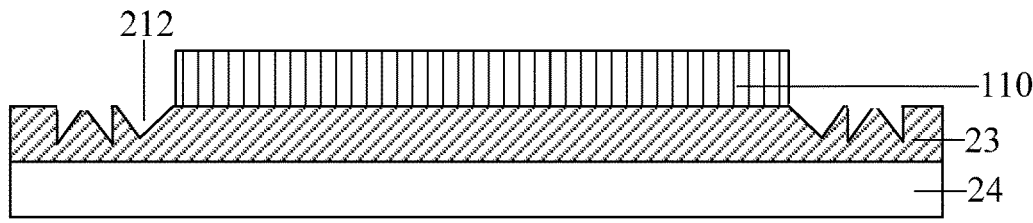
FIG. 7B schematically shows an embodiment of the intermediate structure of the OLED encapsulation structure in the method for manufacturing an OLED encapsulation structure according to the present disclosure.

In an embodiment, the step S701 is similar to the step S601, and includes forming a first inorganic layer covering the OLED device and having a first engaging slot on the outside of the OLED device. FIG. 7B schematically shows the structure of the substrate before the preparation of the first inorganic layer. As shown in FIG. 7B, a buffer layer 23 is disposed on the substrate 24. The edge region of the buffer layer 23 has a second engaging slot 212. In an embodiment, the second engaging slot 212 is a V-shaped engaging slot. The OLED device 110 is disposed on the buffer layer 23. In an embodiment, the OLED device 110 may be located at the central region of the buffer layer 23. The substrate 24 may be a transparent substrate. Specifically, it may be a substrate made of a non-metallic material having a certain hardness and could guiding light, such as glass, quartz, or a transparent resin, etc.

The material of the buffer layer 23 may include at least one of silicon nitride, silicon oxide, and silicon hydroxide. Specifically, a buffer material layer may be formed on the substrate 24 by a plasma chemical vapor deposition process using the above materials. The buffer material layer is then processed by a patterning process to form a second engaging slot 212 to obtain the buffer layer 23.

Figure 7C:
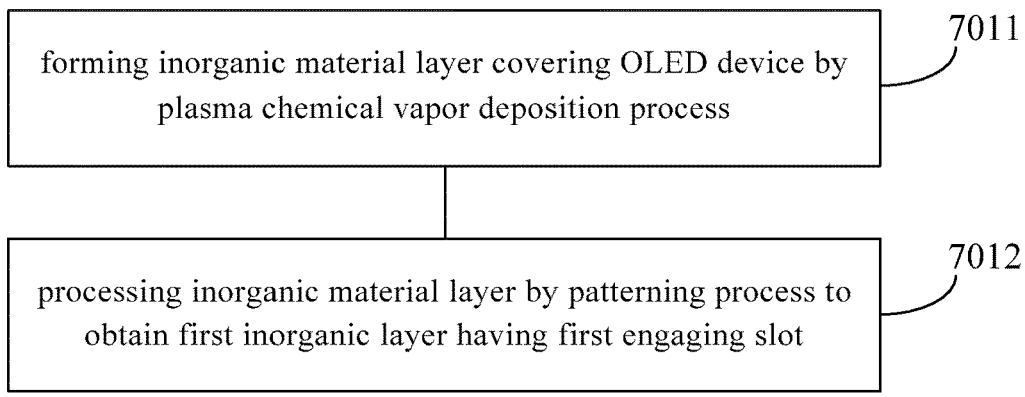
FIG. 7C schematically shows yet another embodiment of the flow of the method for manufacturing the OLED encapsulation structure according to the present disclosure.

FIG. 7C illustrates the sub-steps of the step S701, comprising:

Step S7011: forming an inorganic material layer covering the OLED device by a plasma chemical vapor deposition process on the outside of the OLED device; and Step S7012: processing the inorganic material layer by a patterning process to obtain a first inorganic layer having a first engaging slot.

FIG. 7D shows a schematic structural diagram of the inorganic material layer W formed after the step S7011 is performed. The inorganic material layer W has a second engaging protrusion 211. In an embodiment, the second engaging protrusion 211 is a V-shaped engaging protrusion, and the second engaging protrusion 211 is stuck in the second engaging slot 212. The material of the inorganic material layer W may include at least one of silicon nitride, silicon oxide, and silicon hydroxide, and it may be produced by using a plasma chemical vapor deposition process.

FIG. 7E shows a schematic structural diagram of the first inorganic layer 21a formed after the step S7012 is performed. After the first engaging slot 222 is formed on the inorganic material layer W, the first inorganic layer 21a can be obtained. In an embodiment, the first engaging slot 222 may be a semi-circular engaging slot and a plurality of the first engaging slots 222 are evenly distributed over the first inorganic layer 21a.

In an embodiment of the present disclosure, the inorganic material layer W may be processed by a patterning process to obtain the first inorganic layer 21a. The patterning process includes steps of photoresist coating, exposure, development, etching, and photoresist stripping. Therefore, the process of processing the inorganic material layer W by a patterning process includes: forming a photoresist layer on the inorganic material layer W by a coating process; exposing the photoresist layer with a mask such that the photoresist layer is divided into an exposed region and a non-exposed region; processing the exposed photoresist layer by a developing process to remove the photoresist in the exposed region and retain the photoresist in the non-exposed region; etching an area of the inorganic material layer W corresponding to the exposed region by an etching process to form a first bonding slot 222 on the inorganic material layer W; and removing the photoresist in the non-exposed region to obtain the first inorganic layer 21a.

The step S702 may include forming an organic layer covering the first inorganic layer and having a first engaging protrusion 221 stuck in the first engaging slot 222 by a pre-process on the outside of the first inorganic layer. The pre-process includes any one of a sputtering process, an evaporation process, and a spin coating process. In an embodiment of the present disclosure, as shown in FIG. 5, both film surfaces of the organic layer 22 have first engaging protrusions 221. The orthographic projections of the first engaging protrusions 221 on the two film surfaces of the organic layer 22, which are projected on the plane of the organic layer 22, do not overlap. In another embodiment, the orthographic projections of the first engaging protrusions 221 on the two film surfaces of the organic layer 22, which are projected on the plane of the organic layer 22, are connected. The first engaging protrusion 221 on the film surface of the organic layer 22 closest to the OLED device 110 is stuck with the first engaging slot 222 of the first inorganic layer 21a, and there is no gap between the first engaging protrusion 221 and the first engaging slot 222.

FIG. 7F shows a flow chart of the method for forming an organic layer covering the first inorganic layer on the outside of the first inorganic layer according to an embodiment of the present disclosure. This embodiment will be described by taking the organic layer 22 shown in FIG. 5 as an example. The method includes:

Step S7021: forming an organic material layer covering the first inorganic layer by a pre-process on the outside of the first inorganic layer, such that the side of the organic material layer contacting the first inorganic layer is provided with a first engaging protrusion that is stuck in the first engaging slot; and Step S7022: processing the organic material layer by a patterning process, such that the side of the organic material layer that is not in contact with the first inorganic layer is provided with a first engaging protrusion to obtain an organic layer.

Figure 7G:
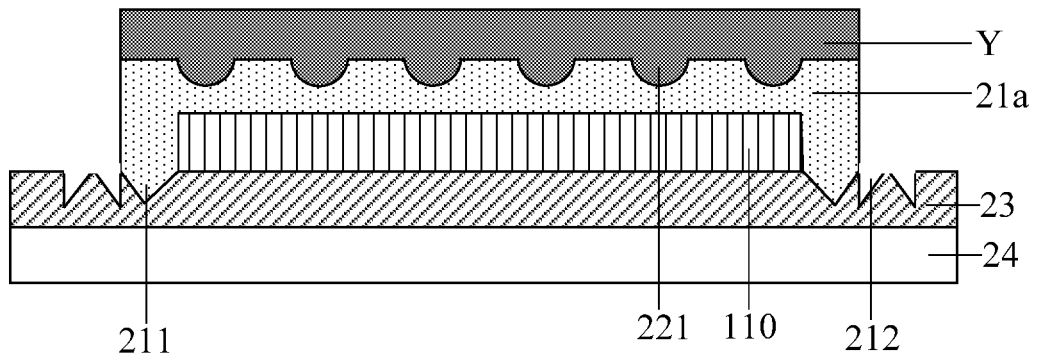
FIG. 7G schematically shows still another embodiment of the intermediate structure of the OLED encapsulation structure in the method for manufacturing an OLED encapsulation structure according to the present disclosure.

FIG. 7G shows the structural diagram of the organic material layer Y formed on the outside of the first inorganic layer according to an embodiment of the present disclosure. Referring to FIG. 7G, a first engaging protrusion 221 is provided on a side of the organic material layer Y that is in contact with the first inorganic layer 21a, the first engaging protrusion 221 is stuck in the first engaging slot 222 of the first inorganic layer 21a. The first engaging protrusion 221 is a semi-circular engaging protrusion. After the first engaging protrusion 221 is stuck in the first engaging slot 222, there is no gap between the first engaging protrusion 221 and the first engaging slot 222. The material of the organic material layer Y may be a polyacrylate material, such as a negative polyacrylate material or the like. In an embodiment of the present disclosure, the organic material layer may be formed outside the first inorganic layer by a pre-process. The pre-process includes any one of a sputtering process, an evaporation process, and a spin coating process. In an embodiment, a negative polyacrylate material layer may be formed on the outside of the first inorganic layer by a sputtering process to form the organic material layer Y.

Figure 7H:
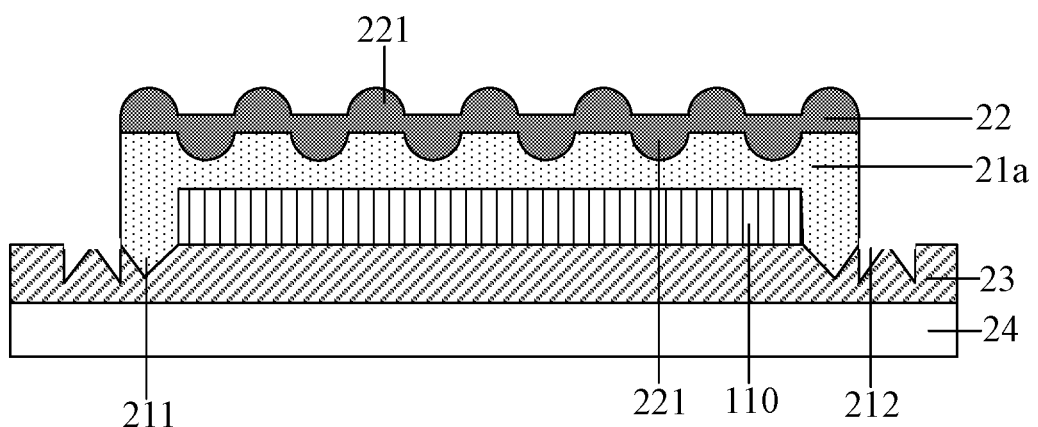
FIG. 7H schematically shows still yet another embodiment of the intermediate structure of the OLED encapsulation structure in the method of manufacturing an OLED encapsulation structure according to the present disclosure.

FIG. 7H shows a schematic structural diagram of the organic material layer Y having been processed by a patterning process according to an embodiment of the present disclosure. The organic layer 22 is obtained by processing the organic material layer Y by a patterning process. First engaging protrusions 221 are formed on both of the film surfaces of the organic layer 22, and the orthographic projections of the first engaging protrusions 221 on the two film surfaces of the organic layer 22 projected on the plane of the organic layer 22 do not have an overlapping area. The patterning process includes photoresist coating, exposure, development, etching, and photoresist stripping. Therefore, processing the organic material layer Y by patterning process includes: forming a photoresist layer on the organic material layer Y by using a coating process; exposing the photoresist layer by using a mask to form an exposed region and a non-exposed region of the photoresist layer; processing the exposed region by a developing process to remove the photoresist in the exposed region, and retain the photoresist in the non-exposed region; etching a part of the organic material layer Y corresponding to the exposed region to form a first engaging slot 222 on the organic material layer Y; removing the photoresist in the non-exposed region to obtain an organic layer 22.

FIG. 5 shows a schematic structural diagram of the second inorganic layer 21b formed on the organic layer 22. The second inorganic layer 21b covers the outside of the organic layer 22, and the second inorganic layer 21b includes a first engaging slot 222 that mates with the first engaging protrusion 221 of the organic layer and a second engaging protrusion 211 that mates with the second engaging slot 212 of the buffer layer 23. Specifically, the second engaging protrusion 211 is stuck in the second engaging slot 212 on the buffer layer 23, and there is no gap between the second engaging protrusion 211 and the second engaging slot 212. The second inorganic layer 21b may be formed using at least one of silicon nitride, silicon oxide, and silicon hydroxide. A second inorganic layer 21b covering the organic layer 22 is formed outside the organic layer 22 by a plasma chemical vapor deposition process to obtain an OLED encapsulation structure as shown in FIG. 5. The specific process will not be described here.

The embodiments of the method for manufacturing the OLED encapsulation structure according to the present disclosure can avoid the misalignment between the film layers because the organic layer is stuck with the inorganic layer, thereby solving the problem of poor packaging effect.

There is also provided a display device according to an embodiment of the present disclosure, comprising the OLED encapsulation structure. The OLED encapsulation structure may be the OLED encapsulation structure 200 shown in FIG. 2 or FIG. 5.

It should be noted that the above-mentioned embodiments are only part of the embodiments of the present application and are not intent to limit the present disclosure. It should also be appreciated that numerous modifications and alternative embodiments covered by the spirit and principle of the present application belong to the protection scope of the present application. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage. Reference numerals in the claims should not be interpreted as a limitation to the protection scope.

We claim:

1. An OLED encapsulation structure, comprising:
   an OLED device, and
   a plurality of film layers and a buffer layer covering the OLED device from different sides of the OLED device,
   wherein the plurality of film layers comprises inorganic layers and organic layers stacked alternately and contacting surfaces of any two film layers in contact with each other among the plurality of film layers comprise complementary topographies such that the any two film layers in contact with each other are stuck with each other,
   wherein the complementary topographies comprise first semicircular engaging slots on one of the any two film layers in contact with each other and first semicircular engaging protrusions on other one of the any two film layers in contact with each other, wherein the first semicircular engaging slots are separated by flat parts of the one of the any two film layers in contact with each other, the first semicircular engaging protrusions are separated by flat parts of the other one of the any two film layers in contact with each other, the first semicircular engaging protrusions are stuck in the first semicircular engaging slots,
   wherein a shape of a longitudinal section of each of the first semicircular engaging slots and a shape of a longitudinal section of each of the first semicircular engaging protrusions are semicircular shapes, the shape of the longitudinal section of each of the first semicircular engaging slots corresponds to the shape of the longitudinal section of each of first semicircular engaging protrusions, and
   wherein the plurality of film layers comprises first film layers, second film layers and third film layers, the first film layers comprise a film layer closest to the OLED device and a film layer farthest from the OLED device, the second film layers are inorganic layers not belonging to the first film layers, and the third film layers are organic layers not belonging to the first film layers,
   wherein two film surfaces of each of the second film layers are provided with the first semicircular engaging slots, and two film surfaces of each of the third film layers are provided with the first semicircular engaging protrusions,
   wherein the film layer closest to the OLED device is directly stuck with the buffer layer through a first mating mechanism that is located at a terminal of the film layer closest to the OLED device, and each one of the second film layers is directly stuck with the buffer layer through a respective second mating mechanism that is located at a terminal of the each one of the second film layers.

2. The OLED encapsulation structure according to claim 1, wherein
   orthographic projections of the first semicircular engaging slots on the two film surfaces of each of the second film layers, which are projected on a plane of the second film layers, do not have an overlapping area, and
   orthographic projections of the first semicircular engaging protrusions on the two film surfaces of each of the third film layer, which are projected on a plane of the third film layers, do not have an overlapping area.

3. The OLED encapsulation structure according to claim 1, wherein
   orthographic projections of the first semicircular engaging slots on the two film surfaces of each of the second film layers, which are projected on a plane of the second film layers, have an overlapping area, and
   orthographic projections of the first semicircular engaging protrusions on the two film surfaces of each of the third film layers, which are projected on a plane of the third film layers, have an overlapping area.

4. The OLED encapsulation structure according to claim wherein each of the first film layers comprises a first film surface in contact with a film layer of the plurality of film layers not belonging to the first film layers, wherein the first film surface comprises the first semicircular engaging slots.

5. The OLED encapsulation structure according to claim 1, wherein:
   each of the first mating mechanism and the respective second mating mechanism comprises a second engaging slot and a second engaging protrusion,
   the second engaging protrusion is stuck in the second engaging slot,
   the second engaging slot of the first mating mechanism is located on the buffer layer and the second engaging protrusion of the first mating mechanism is located on the film layer closest to the OLED device, and
   the second engaging slot of the respective second mating mechanism is located on the buffer layer and the second engaging protrusion of the respective second mating mechanism is located on the each one of the second film layers.

6. The OLED encapsulation structure according to claim 5, wherein:
   a shape of a longitudinal section of the second engaging slot and a shape of a longitudinal section of the second engaging protrusion comprise any one of a semicircular shape, a trapezoidal shape, a U shape, a V shape and a rectangular shape; and the shape of the longitudinal section of the second engaging slot corresponds to the shape of the longitudinal section of the second engaging protrusion.

7. A display device, comprising the OLED encapsulation structure according to claim 1.

8. The OLED encapsulation structure according to claim 1, wherein:

each of the first mating mechanism and the respective second mating mechanism comprises a second engaging slot and a second engaging protrusion, the second engaging protrusion is stuck in the second engaging slot, the second engaging protrusion of the first mating mechanism is located on the buffer layer and the second engaging slot of the first mating mechanism is located on the film layer closest to the OLED device, and the second engaging protrusion of the respective second mating mechanism is located on the buffer layer and the second engaging slot of the respective second mating mechanism is located on the each one of the second film layers.

9. The OLED encapsulation structure according to claim 8, wherein:

a shape of a longitudinal structure of the second engaging slot and a shape of a longitudinal section of the second engaging protrusion comprise any one of a semicircular shape, a trapezoidal shape, a U shape, a V shape and a rectangular shape;

the shape of the longitudinal section of the second engaging slot corresponds to the shape of the longitudinal section of the second engaging protrusion.

10. A method for manufacturing an OLED encapsulation structure, comprising the steps of:

forming a buffer layer and forming an OLED device on the buffer layer;

forming a first inorganic layer covering the OLED device and having first semicircular engaging slots, wherein a shape of a longitudinal section of each of the first semicircular engaging slots is a semicircular shape, the first semicircular engaging slots are separated by flat parts of the first inorganic layer, the first inorganic layer is stuck with the buffer layer through a first a mating mechanism that is located at a terminal of the first inorganic layer;

forming an organic layer covering the first inorganic layer and having first semicircular engaging protrusions on its both sides, wherein the first semicircular engaging protrusions are separated by flat parts of the organic layer, a part of the first semicircular engaging protrusions that are on a side of the organic layer facing the first inorganic layer are stuck in the first semicircular engaging slots, wherein a shape of a longitudinal section of each of the first semicircular engaging protrusions is a semicircular shape, the shape of the longitudinal section of each of the first semicircular engaging slots corresponds to the shape of the longitudinal section of each of the first semicircular engaging protrusions;

forming a second inorganic layer covering the organic layer and having second semicircular engaging slots on its both sides, wherein the second semicircular engaging slots are separated by flat parts of the second inorganic layer, another part of the first semicircular engaging protrusions that are on a side of the organic layer facing away from the first inorganic layer are stuck in a part of the second semicircular engaging slots that are on a side of the second inorganic layer facing the organic layer, wherein a shape of a longitudinal section of each of the second semicircular engaging slots is a semicircular shape, the shape of the longitudinal section of each of the second semicircular engaging slots corresponds to the shape of the longitudinal section of each of the first semicircular engaging protrusions, the second inorganic layer is stuck with the buffer layer through a second mating mechanism that is located at a terminal of the second inorganic layer.

11. The method according to claim 10, wherein the step of forming the first inorganic layer comprises:

forming a first inorganic material layer covering the OLED device by a plasma chemical vapor deposition process, and processing the first inorganic material layer by a patterning process, such that the first semicircular engaging slots are formed on the first inorganic material layer;

wherein the step of forming the organic layer adopts a pre-process, wherein the pre-process comprises any one of a sputtering process, an evaporation process and a spin coating process.

12. The method according to claim 10, wherein the step of forming the organic layer comprises:

forming an organic material layer covering the first inorganic layer by a pre-process, wherein the side of the organic material layer facing the first inorganic layer is provided with the part of the first semicircular engaging protrusion stuck in the first semicircular engaging slots, and wherein the pre-process comprises any one of a sputtering process, an evaporation process and a spin coating process, and processing the organic material layer by a patterning process, such that the side of the organic material layer facing away from the first inorganic layer is provided with the another part of the first semicircular engaging protrusions to obtain the organic layer.

\* \* \* \* \*